(12) United States Patent
Kurunczi et al.

(10) Patent No.: US 9,530,615 B2
(45) Date of Patent: Dec. 27, 2016

(54) TECHNIQUES FOR IMPROVING THE PERFORMANCE AND EXTENDING THE LIFETIME OF AN ION SOURCE

(71) Applicant: Varian Semiconductor Equipment Associates, Inc., Gloucester, MA (US)

(72) Inventors: Peter F. Kurunczi, Cambridge, MA (US); Neil J. Bassom, Hamilton, MA (US); Wilhelm P. Platow, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 716 days.

(21) Appl. No.: 13/955,852

(22) Filed: Jul. 31, 2013

(65) Prior Publication Data

US 2014/0041684 A1 Feb. 13, 2014

Related U.S. Application Data

(60) Provisional application No. 61/680,539, filed on Aug. 7, 2012.

(51) Int. Cl.
*H01J 37/30* (2006.01)
*H01J 37/04* (2006.01)
(Continued)

(52) U.S. Cl.
CPC ......... *H01J 37/3002* (2013.01); *B08B 7/0021* (2013.01); *H01J 27/024* (2013.01);
(Continued)

(58) Field of Classification Search
CPC ...... H01J 27/022; H01J 27/024; H01J 27/026; H01J 27/18; H01J 37/02; H01J 37/045; H01J 37/08; H01J 37/31; H01J 37/32
(Continued)

(56) References Cited

U.S. PATENT DOCUMENTS 5,517,084 A * 5/1996 Leung .................... H01J 27/18
315/111.21
6,135,128 A 10/2000 Graf et al.
(Continued)

FOREIGN PATENT DOCUMENTS

CN 101681782 A 3/2010
CN 102376513 A 3/2012
(Continued)

OTHER PUBLICATIONS

International Search Report and Written Opinion mailed Dec. 9, 2013, for PCT/US2013/053206 filed Aug. 1, 2013.

*Primary Examiner* — Tung X Le
(74) *Attorney, Agent, or Firm* — Nields, Lemack & Frame, LLC

(57) ABSTRACT

A system and method of improving the performance and extending the lifetime of an ion source is disclosed. The ion source includes an ion source chamber, a suppression electrode and a ground electrode. In the processing mode, the ion source chamber may be biased to a first positive voltage, while the suppression electrode is biased to a negative voltage to attract positive ions from within the chamber through an aperture and toward the workpiece. In the cleaning mode, the ion source chamber may be grounded, while the suppression electrode is biased using a power supply having a high current capability. The voltage applied to the suppression electrode creates a plasma between the suppression electrode and the ion source chamber, and between the suppression electrode and the ground electrode.

20 Claims, 6 Drawing Sheets

(51) Int. Cl.
  *B08B 7/00* (2006.01)
  *H01J 27/02* (2006.01)
  *H01J 37/02* (2006.01)
  *H01J 37/08* (2006.01)

(52) U.S. Cl.
  CPC ............ *H01J 37/02* (2013.01); *H01J 37/045* (2013.01); *H01J 37/08* (2013.01); *H01J 2237/022* (2013.01)

(58) Field of Classification Search
  USPC ........................................ 315/111.31, 111.81
  See application file for complete search history.

(56) References Cited

U.S. PATENT DOCUMENTS

| | | | |
|---|---|---|---|
| 6,221,169 B1 | 4/2001 | Bernstein et al. | |
| 6,356,026 B1* | 3/2002 | Murto | H01J 27/08 250/426 |
| 6,812,648 B2 | 11/2004 | Luten et al. | |
| 6,992,311 B1 | 1/2006 | Ring et al. | |
| 7,531,819 B2 | 5/2009 | DiVergilio et al. | |
| 7,629,590 B2 | 12/2009 | Horsky et al. | |
| 7,655,931 B2 | 2/2010 | Gupta | |
| 7,888,662 B2 | 2/2011 | Biloiu et al. | |
| 7,947,129 B2* | 5/2011 | Murata | H01J 27/16 118/723 FE |
| 2005/0016838 A1 | 1/2005 | Murata et al. | |
| 2006/0097645 A1* | 5/2006 | Horsky | C23C 14/48 315/111.81 |
| 2007/0108395 A1 | 5/2007 | Horsky et al. | |
| 2007/0241689 A1 | 10/2007 | Horsky et al. | |
| 2008/0223409 A1* | 9/2008 | Horsky | B08B 7/00 134/22.1 |
| 2010/0155619 A1 | 6/2010 | Koo et al. | |

FOREIGN PATENT DOCUMENTS

| | | |
|---|---|---|
| JP | 2001-229841 A | 8/2001 |
| JP | 2012-038668 A | 2/2012 |
| WO | 00-54899 A1 | 9/2000 |

* cited by examiner

TECHNIQUES FOR IMPROVING THE PERFORMANCE AND EXTENDING THE LIFETIME OF AN ION SOURCE

This application claims priority of U.S. Provisional Patent Application Ser. No. 61/680,539, filed Aug. 7, 2012, the disclosure of which is incorporated herein by reference in its entirety.

FIELD

The present disclosure relates generally to techniques for manufacturing electronic devices, and more particularly, to techniques for improving the performance and extending the lifetime of an ion source.

BACKGROUND

Ion implantation is a process by which dopants or impurities are introduced into a substrate via bombardment. In semiconductor manufacturing, the dopants are introduced to alter electrical, optical, or mechanical property. For example, dopants may be introduced into an intrinsic semiconductor substrate to alter the type and level of conductivity of the substrate. In manufacturing an integrated circuit (IC), a precise doping profile is often important for proper IC performance. To achieve a desired doping profile, one or more dopants may be implanted in the form of ions in various doses and various energy levels.

Referring to FIG. 1, there is shown a conventional ion implantation system 100. As illustrated in the figure, the ion implantation system 100 may comprise an ion source and a complex series of beam-line components through which an ion beam 10 passes. The ion source may comprise an ion source chamber 102 where desired ions are generated. The ion source may also comprise a power source 101 and an extraction electrode assembly 104 disposed near the ion source chamber 102. As illustrated in the figure, the extraction electrode assembly 104 may include a suppression electrode 104a and a ground electrode 104b. Each of the ion source chamber 102, the suppression electrode 104a, and the ground electrode 104b may include an aperture: the ion source chamber 102 may include an extraction aperture (not shown), the suppression electrode may include a suppression electrode aperture (not shown), and a ground electrode may include a ground electrode aperture (not shown). The apertures may be in communication with one another so as to allow the ions generated in the ion source chamber 102 may pass through, toward the beam-line components. Hereinafter, the suppression electrode aperture and the ground electrode aperture may collectively be referred as an extraction electrode aperture assembly.

The beam-line components, meanwhile, may include, for example, a mass analyzer 106, a first acceleration or deceleration (A1 or D1) stage 108, a collimator 110, and a second acceleration or deceleration (A2 or D2) stage 112. Much like a series of optical lenses that manipulate a light beam, the beam-line components can filter, focus, and manipulate ions or ion beam 10 having desired species, shape, energy, and other qualities. The ion beam 10 that passes through the beam-line components may be directed toward a substrate 114 that is mounted on a platen 116 or clamp. The substrate 114 may be moved in one or more dimensions (e.g., translate, rotate, and tilt) by an apparatus, sometimes referred to as a "roplat." It should be appreciated by those skilled in the art that the entire path traversed by the ion beam 10 is typically evacuated during ion implantation.

The ion source is an important component of the ion implanter system 100. The ion source is required to generate a stable, well-defined ion beam 10 for a variety of different ion species and extraction voltages. It is therefore desirable to operate the ion source for extended periods of time without the need for maintenance or repair. The lifetime of the ion source or mean time between failures (MTBF) is one performance criteria of the ion source and an important metric for the performance of an ion implanter system 100.

One cause of ion source failure is accumulation of materials on the inner wall of the ion source chamber 102, the suppression electrode and the ground electrode. In addition, the materials may accumulate on the apertures. If formed on the inner wall of the ion source chamber 102, the materials may reduce the rate by which ions are generated and reduce the beam current.

Moreover, the ions generated and emitted from an ion source under such a condition may be less than optimal. The ions 10 may be unstable and may cause ion beam current drifts and, in some cases, a higher frequency of glitches. If materials are accumulated on the extraction aperture or the extraction electrode 104, the shape of the ion beam 10 extracted from the ion source chamber 202 may be distorted. For example, the shape of the beam 10 may reflect the shape of the materials accumulated on the extraction aperture, the suppression electrode aperture, and/or the ground electrode aperture. Therefore, the ion source may not generate a stable, well-defined ion beam 10. Such a distortion, if excessive, may be difficult to correct with the beam-line components. Accordingly, less than optimal IC may be produced.

One way to prevent the effect of the material accumulation is to intermittently replace the ion source with a clean ion source. Alternatively, the ion source may have to be manually cleaned after powering down the entire ion implanter and after releasing the vacuum. However, these measures require the ion source or the entire ion implanter system 100 to be powered down and to release the vacuum within the system 100. Moreover, the ion implanter system 100, after replacing or cleaning the ion source, must be powered and evacuated to reach operational condition. Accordingly, these maintenance processes may be very time consuming. In addition, the ion implanter system 100 is not used during the maintenance processes. As such, frequent maintenance processes may decrease IC production time, while increasing its manufacturing cost and placing excessive financial burden on the manufacturers and, ultimately, the consumers. In view of the foregoing, it would be desirable to provide a new technique for improving the performance and extending the lifetime of an ion source to overcome the above-described inadequacies and shortcomings.

SUMMARY

A system and method of improving the performance and extending the lifetime of an ion source is disclosed. The ion source includes an ion source chamber, a suppression electrode and a ground electrode. In the processing mode, the ion source chamber may be biased to a first positive voltage, while the suppression electrode is biased to a negative voltage to attract positive ions from within the chamber through an aperture and toward the workpiece. In the cleaning mode, the ion source chamber may be grounded, while the suppression electrode is biased using a power supply having a high current capability. The voltage applied to the suppression electrode creates a plasma between the suppression electrode and the ion source chamber, and between the suppression electrode and the ground electrode.

According to a first embodiment, an ion source is disclosed. This ion source comprises an ion source chamber for generation of a plasma during a processing mode, having an extraction aperture disposed on one surface; a suppression electrode having a suppression electrode aperture disposed therein, the suppression electrode disposed proximate the extraction aperture; a ground electrode having a ground electrode aperture disposed therein, the ground electrode disposed proximate the suppression electrode; an extraction power supply in communication with the ion source chamber, configured to supply a first extraction voltage and current during the processing mode and a second extraction voltage and current during a cleaning mode; and a suppression power supply in communication with the suppression electrode, configured to supply a first suppression voltage and current during the processing mode and a second suppression voltage and current during the cleaning mode, wherein a difference between the second extraction voltage and the second suppression voltage is sufficient to create a plasma in a volume defined between the extraction aperture and the suppression electrode.

According to a second embodiment, a method of cleaning an ion source is disclosed, wherein the ion source comprises an ion source chamber having an extraction aperture, a ground electrode, and a suppression electrode disposed between the ion source chamber and the ground electrode. This method comprises flowing a cleaning agent into the ion source chamber; applying a respective voltage to each of the ion source chamber, the suppression electrode and the ground electrode, such that a difference in voltage between the suppression electrode and each of the ion source chamber and the ground electrode is sufficient to generate a plasma from the flowing cleaning agent in the volume defined between the extraction aperture and the ground electrode; and wherein the generation of the plasma causes cleaning of the extraction aperture, the suppression electrode and the ground electrode.

According to a third embodiment, an ion source is disclosed, comprising an ion source chamber for generation of a plasma during a processing mode, having an extraction aperture disposed on one surface; a suppression electrode having a suppression electrode aperture disposed therein, the suppression electrode disposed proximate the extraction aperture; a ground electrode having a ground electrode aperture disposed therein, the ground electrode disposed proximate the suppression electrode and connected to ground; an extraction power supply in communication with the ion source chamber, comprising a first switch and processing extraction power supply to supply a first extraction voltage and current during the processing mode, wherein the first switch couples the ion source chamber to ground during a cleaning mode; a suppression power supply in communication with the suppression electrode, the suppression power supply comprising a processing suppression power supply to supply a first suppression voltage and current during the processing mode, a cleaning suppression power supply to supply a second suppression voltage and current during the cleaning mode, and a second switch to select between the processing suppression power supply and the cleaning suppression power supply; a feed source containing a cleaning agent and in communication with the ion source chamber; and a flowrate controller to regulate flow of the cleaning agent, wherein the flowrate controller is configured to create a flow rate of the cleaning agent of at least 10 SCCM during the cleaning mode, and wherein the cleaning suppression power supply provides a voltage of between 400 and 1000V at a current of between 1 A and 5 A to the suppression electrode such that a plasma is created between the suppression electrode and the ion source chamber and between the suppression electrode and the ground electrode.

BRIEF DESCRIPTION OF THE FIGURES

For a better understanding of the present disclosure, reference is made to the accompanying drawings, which are incorporated herein by reference and in which.

DETAILED DESCRIPTION

Herein, a new technique for improving the performance and extending the lifetime of an ion source is disclosed. For purposes of clarity and simplicity, the present disclosure may focus on the technique for improving the performance and extending the lifetime of an indirectly heated cathode (IHC) source in a ribbon beam ion implantation system. Those of ordinary skill in the art will recognize that the present disclosure, however, is not limited to a particular ion source or a particular ion implantation system. The present disclosure may be equally applicable to other types of ion source including, for example, Bernas source or RF plasma source, in other types of ion implantation systems including, for example, multiple wafer (e.g. batch), spot beam ion implantation system or plasma based ion implantation system, with or without the beam-line components. In addition, the present disclosure may be equally applicable to other plasma based substrate processing systems or other systems that use ions.

Figure 2:
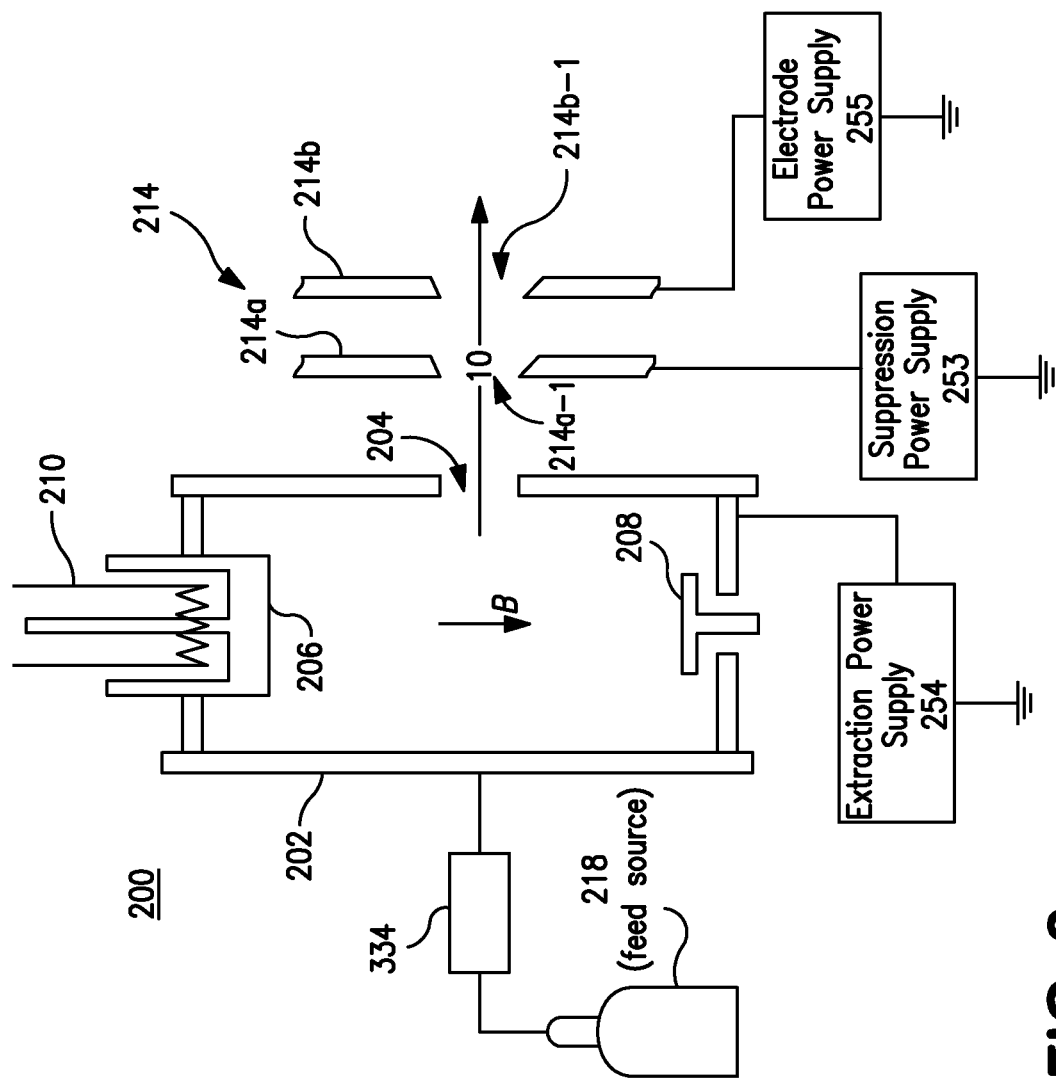
FIG. 2 is an ion source according to a first embodiment.

Referring to FIG. 2, there is shown a simplified illustration of an exemplary ion source 200 according to one embodiment of the present disclosure. The ion source 200 may be an IHC ion source, as illustrated in the figure, or other types of ion sources. IHC ion source 200 may include an ion source chamber 202. On the front side of the ion source chamber 202, an extraction aperture 204 may be disposed. A cathode 206 and a repeller electrode 208 (or anti-cathode) may be positioned in the opposite sides of the ion source chamber 202. A filament 210 may be positioned outside the ion source chamber 202 and in close proximity to the cathode 206 to heat the cathode 206. One or more source magnets (not shown) may also be provided to produce a magnetic field B (see arrow B) in the ion source chamber 202.

Near the ion source chamber 202, there may be one or more feed sources 218. In the present disclosure, material provided from the feed source 218 may include source material and/or additional material. The source material may contain dopant species that may be introduced into the substrate (see FIG. 1) in the form of ions. Meanwhile, the additional material may include diluent, which may be introduced into the ion source chamber 202 along with the source material to dilute the concentration of the source material in the chamber 202. The additional material may also include cleaning agent that may be introduced into the ion source chamber 202 with or without the source material to clean the ion source chamber 202.

In the present disclosure, various species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize that the above species are not exhaustive, and other atomic or molecular species may also be used. Depending on the applications, the species may be used as the dopants or the additional material. In particular, one species used as the dopants in one application may be used as the additional material in another application, or vice-versa.

Preferably, the source and/or additional material is provided into the ion source chamber 202 in gaseous or vapor form. If the source and/or additional material is in non-gaseous or non-vapor form, a vaporizer (not shown) may be provided near the feed source 218 to convert the material into gaseous or vapor form. To control the amount and the rate by which the source and/or the additional material is provided into the ion source chamber 202, a flowrate controller 334 may be provided.

Proximate to the ion source chamber 202, near the extraction aperture 204, an extraction electrode assembly 214 may be disposed. In the present embodiment, the extraction electrode assembly 214 may comprise a suppression electrode 214a and a ground electrode 214b. Each of the suppression electrode 214a and the ground electrode 214b may have an aperture that is in communication with the extraction aperture 204 of the ion source chamber 202. In the suppression electrode 214a, there may be a suppression electrode aperture 214a-1, whereas a ground electrode aperture 214b-1 may be disposed and defined in the ground electrode 214b. Hereinafter, the suppression electrode aperture 214a-1 and the ground electrode aperture 214b-1 may be collectively referred to as an extraction electrode aperture assembly, which is in communication with the extraction aperture 204 of the ion source chamber 202.

In order to power the ion source chamber 202, the cathode 206, the filament 210, the repeller electrode 208, the suppression electrode 214a, and/or the ground electrode 214b, one or more power supplies may be provided. For the purpose of clarity and simplicity, only three power supplies are shown. Those of skill in the art will recognize that there may be multiple power supplies, each of which may be electrically coupled to different components of the ion source 200. Or, there may be multiple power supplies where one of the power supplies may be electrically coupled to multiple components. In yet another embodiment, a single power supply, having a plurality of outputs may be used to power all of the components in the system 200. In the present disclosure, the power supplies 253, 254, 255 may provide continuous or pulsed, alternating current (AC) or direct current (DC). The power supplies 253, 254, 255 may also provide positive or negative bias voltage. Further, the power supplies 253, 254, 255 may also provide a path by which the ion source chamber 202, the cathode 206, the filament 210, the repeller electrode 208, the suppression electrode 214a, and/or the ground electrode 214b may be grounded.

The ground electrode 214b may be biased by a ground electrode power supply 255. In some embodiments, the ground electrode 214b is grounded, thereby obviating the need for the ground electrode power supply 255. The suppression electrode 214a may be powered by a suppression power supply 253. An extraction power supply 254 is used to bias the walls of the ion source 202. In some embodiments, the suppression power supply 253 and/or the extraction power supply 254 may be referenced to the ground electrode 214b.

As noted above, one cause of the ion source 200 failure may be excessive accumulation of materials during its extended use. For example, materials may accumulate on the walls of, among others, the ion source chamber 202, the extraction aperture 204, suppression electrode aperture 214a-1, and the ground electrode aperture 214b-1. In some embodiments, this accumulation of material may be more severe when carborane, $SiF_4$ or $GeF_4$ is used as the source material. To prevent excessive accumulation, the ion source 200 of the present embodiment may operate in two modes: processing mode and cleaning mode. During the processing mode, the ion source 200 may generate dopant ions. During the cleaning mode, the ion source 200 may be in situ cleaned. In the present disclosure, the ion source 200 may operate in the processing mode and cleaning mode.

Figure 3A:
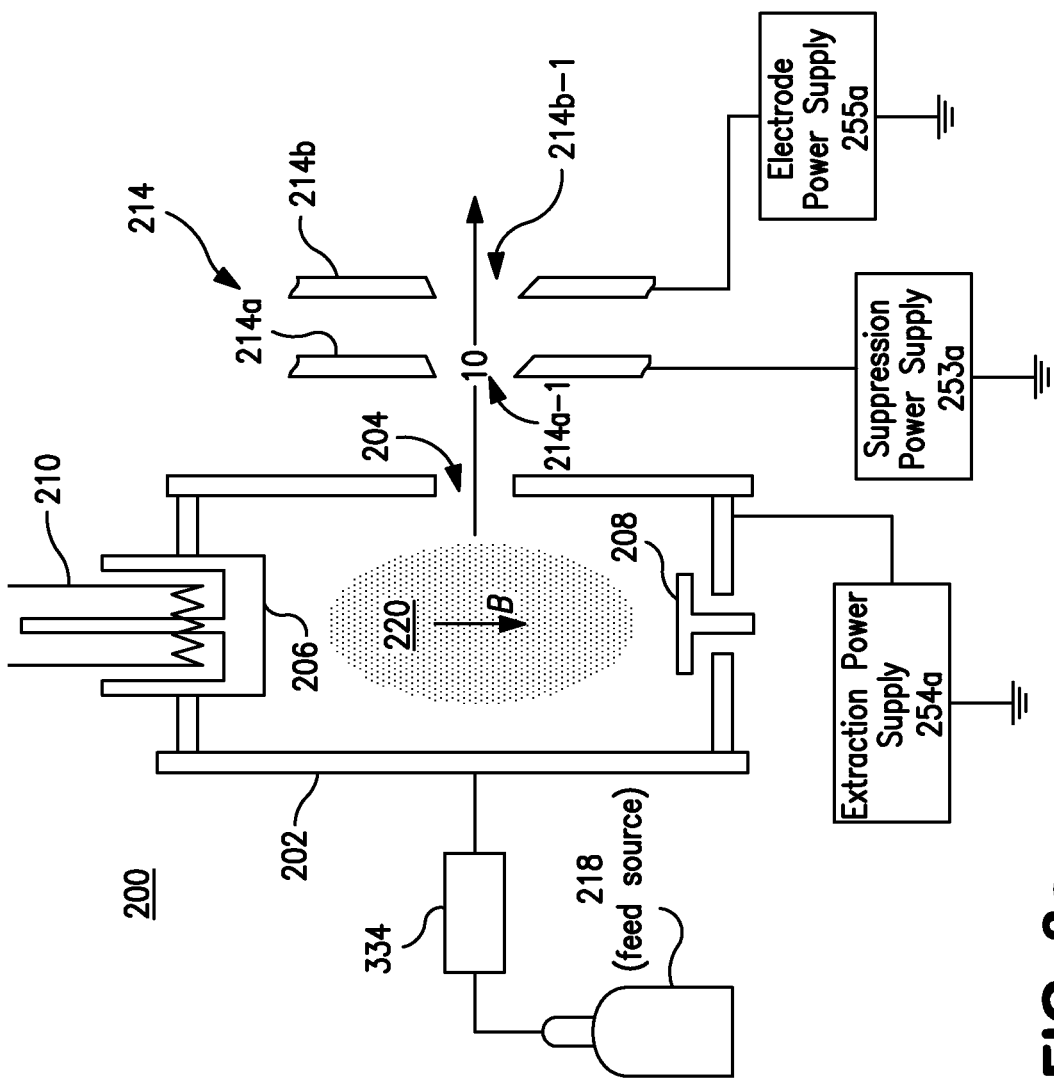
FIG. 3*a* shows the ion source of FIG. 2 operating in processing mode.

Referring to FIG. 3a, there is shown the ion source 200 operating under the processing mode, according to one embodiment of the present disclosure. It should be appreciated that all of the components illustrated in FIG. 2 are incorporated into FIG. 3a. As such, the components in FIG. 3a should be understood in relation to the components in FIG. 2.

During the processing mode, the source material containing dopant species may be introduced into the ion source chamber 202 from the feed source 218. In some embodiments, the additional material also may be introduced into the ion source chamber 202, independently of the source material or along with the source material. Meanwhile, the filament 210 may be powered to emit electrons toward the cathode 206 via thermionic emission. The cathode 206, in turn, may emit electrons in the ion source chamber 202 to generate a first plasma 220 containing, among others, dopant ions.

Figure 1:
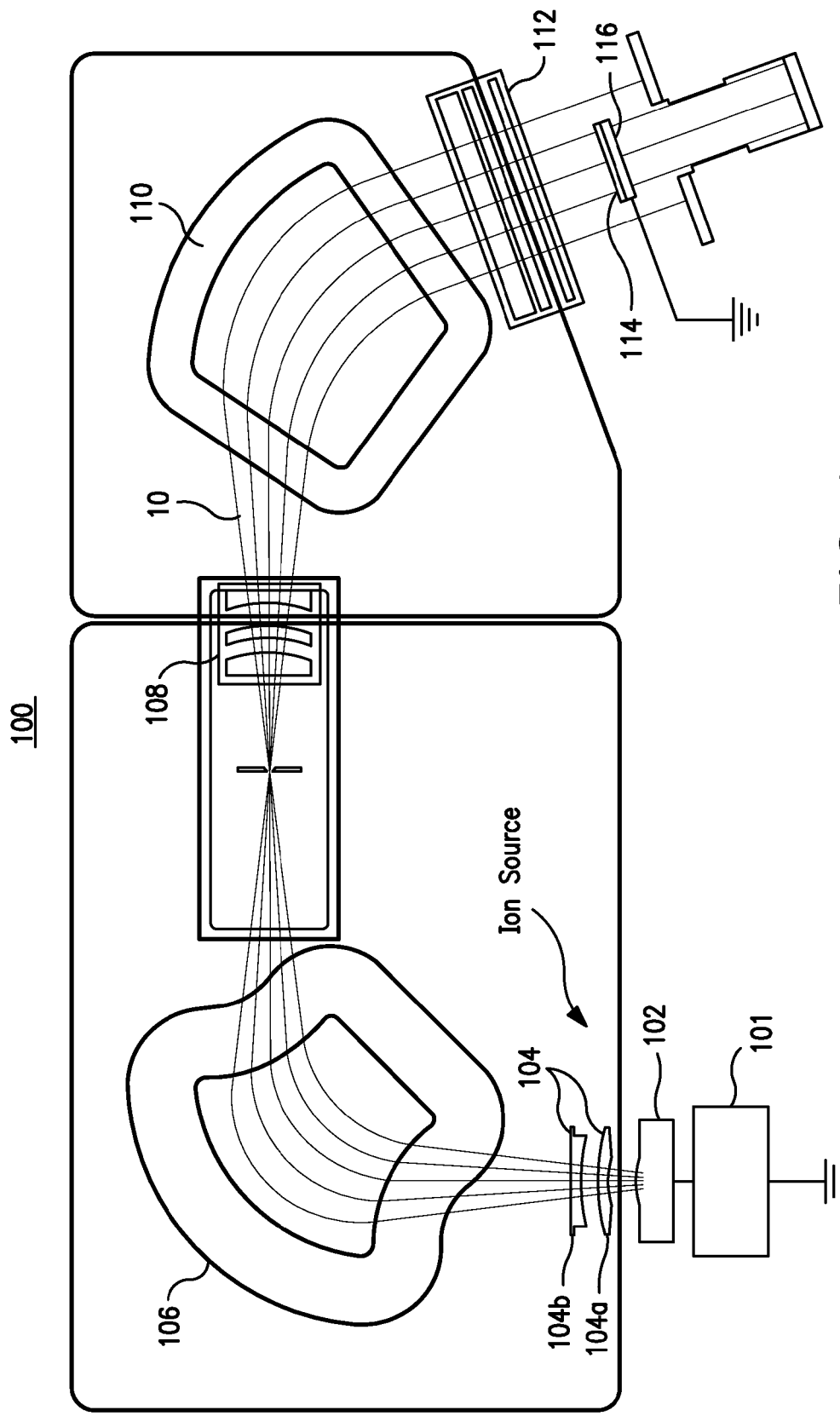
FIG. 1 is an ion implantation system in accordance with the prior art.

The ground electrode 214b may be biased by the processing ground electrode power supply 255a so as to extract the ions 10 from the ion source chamber 202. In some embodiments, the ground electrode 214b may be grounded and is not in communication with a power supply. Such ions 10 may be directed toward the substrate (FIG. 1). In one embodiment, the processing suppression power supply 253a may provide +/− bias voltage and continuous/pulsed, AC/DC to the suppression electrode 214a. In one particular embodiment, the processing suppression power supply 253a may supply about −500 V to −30 kV at about 100 mA to the suppression electrode 214a. The extraction power supply 254a may supply between about 0.5 kV and 70 kV to the ion source 202. The extraction power supply 254a may be able to supply between 0.5 mA and up to about 200 mA of current.

In the processing mode, the ions may be extracted from the ion source chamber 202 while reducing excessive movement of the electrons in the ion beam 10. It will be understood that the voltage and current noted above are given by way of example only and are not limiting as to the scope of present disclosure. Also, it will be understood that the voltage and current provided by the power supplies 253a, 254a, 255a may be constant or varied.

Figure 3B:
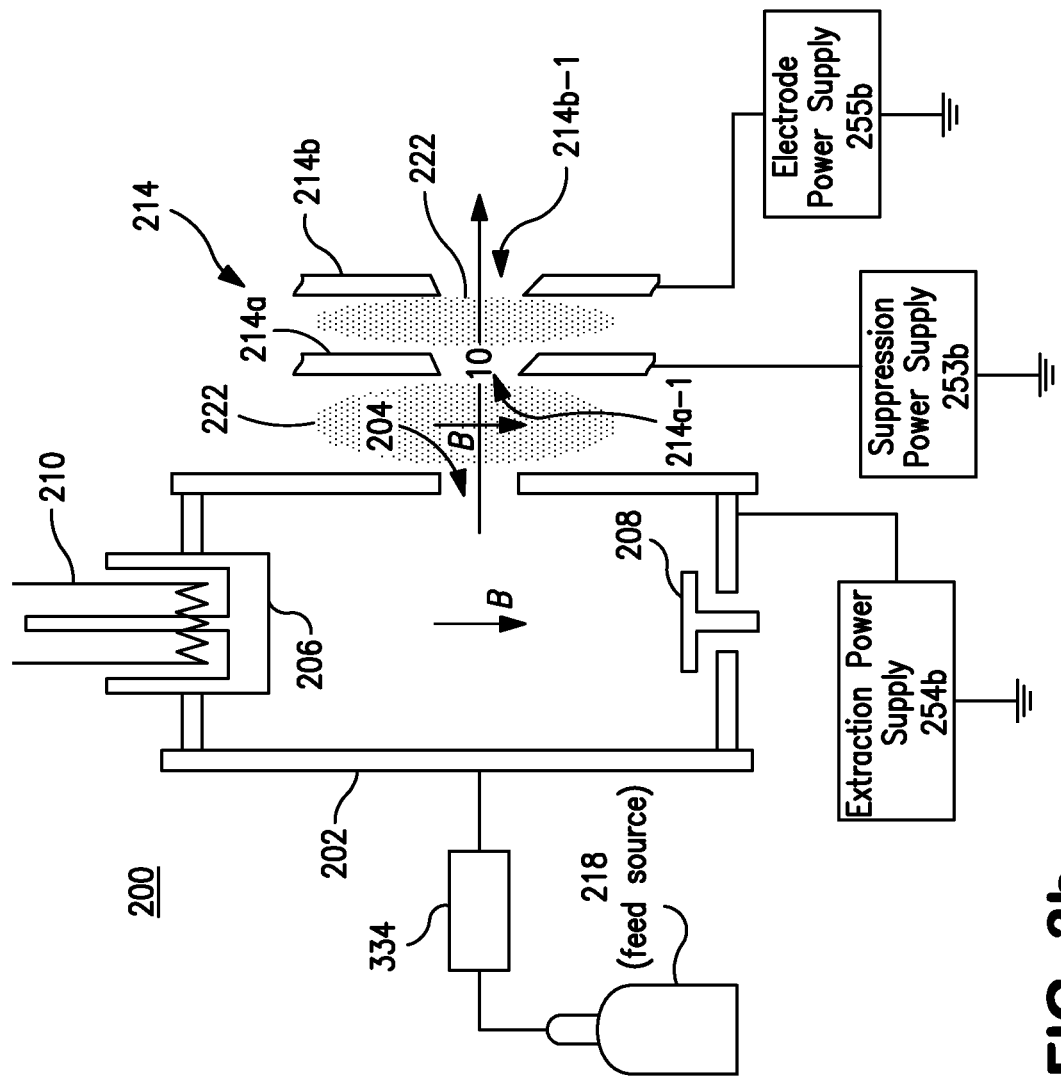
FIG. 3*b* shows the ion source of FIG. 2 operating in a cleaning mode.

Referring to FIG. 3b, there is shown the ion source 200 operating under the cleaning mode, according to one embodiment of the present disclosure. It should be appreciated that most of the components illustrated in FIG. 2 are incorporated into FIG. 3b. As such, most of the components in FIG. 3b should be understood in relation to the components in FIG. 2.

During the cleaning mode, the ion source may be in situ cleaned. In the present embodiment, the cleaning agent may be introduced into the ion source chamber 202 at a high flow rate. For example, the cleaning agent may be introduced at a flow rate of about 25 standard cubic centimeters per minute (SCCM) to about 200 SCCM. Preferably, the cleaning agent may be introduced at about 50 SCCM to about 100 SCCM to maintain high pressure between the ion source chamber 202 and the electrode assembly 214. However, the present disclosure does not preclude a scenario where the cleaning agent is introduced at a flow rate of at least about 25 SCCM. In another embodiment, the cleaning agent is introduced at a flow rate of at least 10 SCCM.

Various species may be introduced as the cleaning agent. The cleaning agent may be atomic or molecular species containing chemically reactive species. Such species, when ionized, may chemically react with the materials accumulated on the wall aperture of the ion source or with the materials accumulated near the extraction electrode aperture assembly. Although cleaning agent with chemically reactive species is preferred, the present disclosure does not preclude utilizing chemically inert species. In another embodiment, the cleaning agent may contain heavy atomic species which, when ionized, may form ions with high atomic mass units (amu). Although species containing heavy atomic species is preferred, the present disclosure does not preclude using light species such as He. Examples of the cleaning agent may include atomic or molecular species containing H, He, N, O, F, Ne, Cl, Ar, Kr, and Xe, or a combination thereof. Preferably, $NF_3$, $O_2$, or a mixture of Ar and $F_2$, or a combination thereof, may be used as the cleaning agent. It should be understood that other species not listed above may also be used as the cleaning agent.

In this cleaning mode, the filament 210 and the cathode 206 are not energized so no plasma is generated within the ion source chamber 202.

In the ion source, a second plasma, or cleaning plasma, 222 may be generated. In the present embodiment, the second plasma 222 may be generated in the area extending from the ion source chamber 202 to the ground electrode 214b. In some embodiments, the second plasma 222 may diffuse beyond the ground electrode 214b, in the area between the ground electrode 214b and the beam-line component. Thus, in the present embodiment, the second plasma 222 may be created in the volume defined between the extraction aperture 204 and the ground electrode 214b. However, the disclosure does not preclude the creation of the second plasma 222 in the volume defined between the extraction aperture 204 and the suppression electrode 214a. In the present embodiment, the second plasma 222 may contain fragments (e.g. electrons, ions, neutrals, other radicals, etc. . . . ) of the cleaning agent. However, those of ordinary skill in the art will recognize that the second plasma 222 may also contain fragments of the source material including dopant ions. For example, these fragments of source material may be removed from the surfaces of the electrodes 214 during the cleaning process. In some embodiments, the chemical species or fragments contained in the second plasma 222 may be identical to the chemical species contained in the first plasma 220 generated to process the substrate 114 (FIG. 1). Yet in other embodiments, the second plasma 222 may also contain fragments of other additional materials.

As described above, in some embodiments, the flow rate of the cleaning agent may be least 50 SCCM. However, in other embodiments, a lower flow rate, such as 10 SCCM or 25 SCCM, may be used. The cleaning agent may be provided at a flow rate sufficient to insure that the second plasma 222 is generated in the volume defined between the ion source chamber 202 to the ground electrode 214b.

The second plasma 222, in the present embodiment, may be generated by providing continuous or pulsed, AC or DC voltage to the suppression electrode 214a. For example, about 400 V to 1 kV at about 1 A to about 5 A of current may be supplied to the suppression electrode 214a using a cleaning suppression power supply 253b. The power may be in the form of AC voltage or pulsed DC voltage to the suppression electrode 214a. This power may be provided by the same suppression power supply used in FIG. 3a, or may be provided by a different power supply, as described in more detail below. Meanwhile, at least one of the ion source chamber 202 and the ground electrode 214b may be grounded. This may be accomplished by outputting a 0 volt output from cleaning power supplies 254b, 255b. In another embodiment, the ion source chamber 202 and/or the ground electrode 214b may be connected directly to ground, such as through a switch. In other embodiments, the cleaning extraction power supply 254b and the cleaning ground electrode power supply 255b may provide non-zero voltages to their respective components.

To increase the density of the second or cleaning plasma 222, one or more source magnets may be activated to produce a magnetic field B (see arrow B) near the suppression electrode 214a. The magnetic field B may also serve to confine the cleaning plasma 222 to the volume defined between the ion source chamber 202 and the ground electrode 214b.

Those of ordinary skill in the art will recognize that a plasma 222 is generated between the suppression electrode 214a and the ion source 202 due to the difference in potential between these two components. Similarly, a plasma 222 is generated between the suppression electrode 214a and the ground electrode 214b due to the difference in potential between these two components. Thus, although the disclosure describes the creation of a plasma 222 through the application of a voltage to the suppression electrode 214a while holding the ion source 202 and the ground electrode 214b at ground, other embodiments are also possible. For example, similar current and/or voltage may be applied to the ground electrode 214b, instead or in addition to the suppression electrode 214a, to generate the second plasma 222 near the ground electrode 214b.

By generating the second or cleaning plasma 222 near the extraction aperture 204, the suppression electrode 214a, the suppression electrode aperture 214a-1, the ground electrode 214b, and the ground electrode aperture 214b-1, the electrodes and the apertures may be cleaned. For example, chemically reactive radicals contained in the cleaning plasma 222 may remove the materials accumulated on the wall of the electrodes 214 and the apertures via chemical reaction. In addition, the ions in the cleaning plasma 222 may remove the accumulated materials via sputtering process. The heat generated from the cleaning plasma 222 may also enhance the cleaning process as the materials accumulated on the walls of the chamber and apertures may be removed by the heat or may become more volatile with increased temperature. For example, as described above, the suppression electrode 214a may be provided with a voltage of between 400 and 1000V at a current of between 1 to 5 amps. Thus, it is possible to generate from kW up to about 5 kW of heat using this suppression power supply 253b. Thus, by providing highly reactive and/or heavy cleaning species, and generating the second plasma 222 near the ion source chamber 202, the suppression electrode 214a, and the ground electrode 214b, effective plasma cleaning may be performed. As noted above, high flow rate by which the cleaning materials are introduced into the ion source chamber 202 may enhance the cleaning process. This technique, unlike conventional techniques, may be performed in situ, and the ion source 200 of the present disclosure need not power down, and the vacuum near the ion source 200 or of the entire ion implanter may be maintained.

Thus, this cleaning mode may create four conditions which are beneficial for cleaning of the extraction region. Namely, high gas flow rates, chemically reactive species formation, ion sputtering and surface heating all contribute to the cleaning process.

The use of different designators for the processing suppression power supply 253a and cleaning suppression power supply 253b is done to indicate that the power being supplied to the suppression electrode 214a may differ depending on the mode of operation. However, in some embodiments, both voltages may be supplied by a single power supply 253 capable to meeting both power requirements. In other embodiments, different power supplies are used in each mode, as described in more detail below. The same is true for the processing extraction power supply 254a and the cleaning extraction power supply 254b, as well as the processing ground electrode power supply 255a and the cleaning ground electrode power supply 255b.

Figure 4:
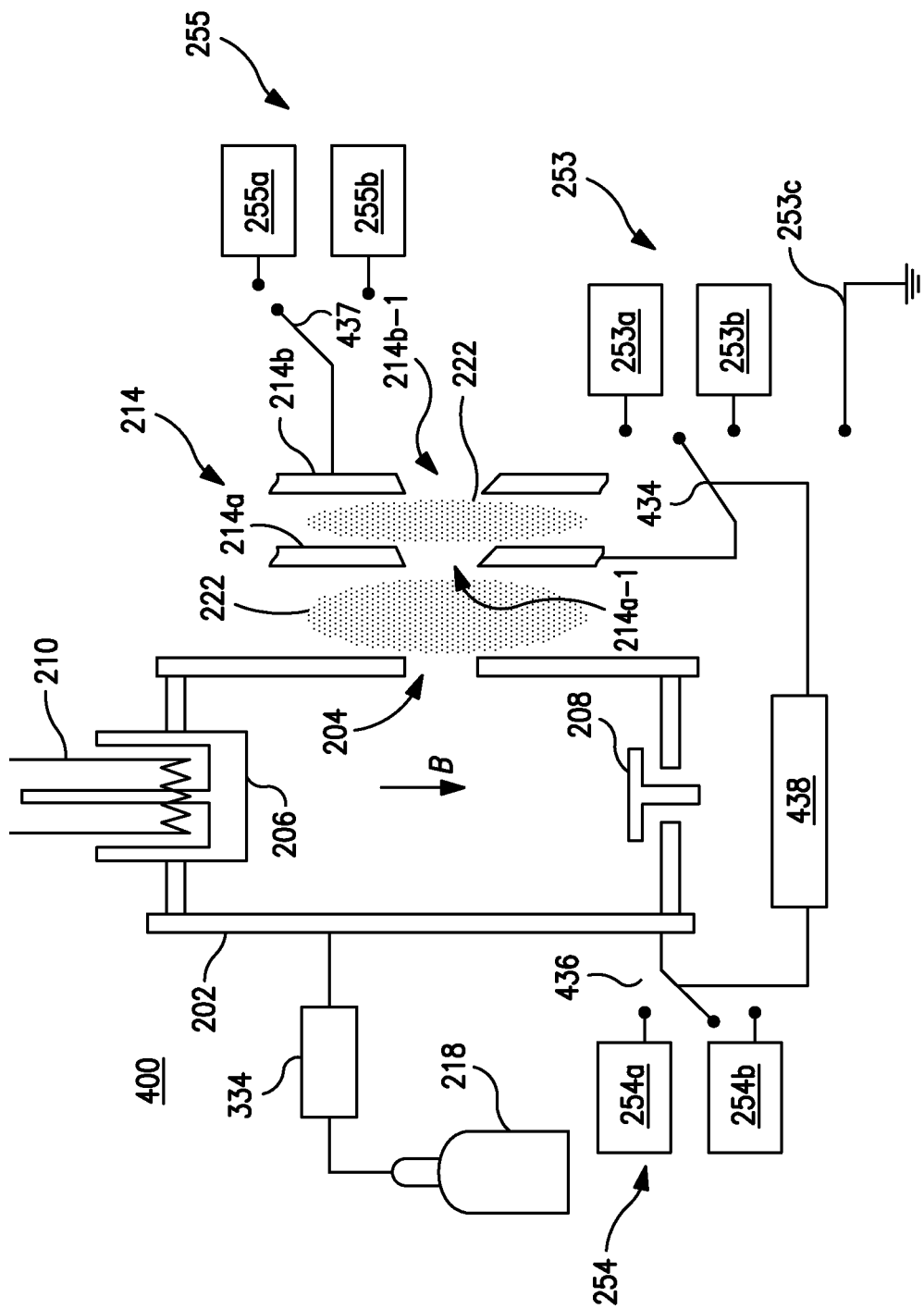
FIG. 4 shows an ion source according to a second embodiment.

Referring to FIG. 4, there is shown a simplified illustration of another exemplary ion source 400 according to another embodiment of the present disclosure. In the present embodiment, the ion source 400 may operate in the processing mode and the cleaning mode sequentially, without powering down. It should be appreciated that many of the components illustrated in FIG. 2 are incorporated into FIG. 4. Such components, and their operation, should be understood in relation to the components in FIG. 2.

As illustrated in the figure, the ion source 400 may be an indirectly heated cathode (IHC) ion source, as illustrated in the figure, or other types of ion sources. Similar to IHC shown in FIGS. 2, 3a and 3b, IHC ion source 400 of the present embodiment may include an ion source chamber 202, on front of which an extraction aperture 204 is disposed. The ion source 400 may also comprise a cathode 206, a filament 210, and a repeller electrode 208 (or anti-cathode). One or more source magnets (not shown) may also be provided to produce a magnetic field B (see arrow B) in the ion source chamber 202.

The ion source 400 may also include an extraction electrode assembly 214, which may comprise a suppression electrode 214a and a ground electrode 214b. One or more feed sources 218 may be provided near the ion source chamber 202 to provide source and additional material. Moreover, a vaporizer (not shown) may also be provided to convert the source material and/or the additional material in non-gaseous or non-vapor form to gaseous or vapor form.

A suppression power supply 253 may be provided to power the suppression electrode 214a. The suppression power supply 253 may comprise a processing suppression power supply 253a (as shown in FIG. 3a) and a cleaning suppression power supply 253b (as shown in FIG. 3b) that are electrically coupled to the suppression electrode 214a during different modes of operation. During the processing mode, the suppression electrode 214a may be electrically coupled to the processing suppression power supply 253a via the first switch 434. Meanwhile, the suppression electrode 214a may be electrically coupled to the cleaning suppression power supply 253b via the first switch 434 during the cleaning mode. The power supply 253 may optionally include a first ground path 253c independent of the processing suppression power supply 253a and the cleaning suppression power supply 253b, the path by which the suppression electrode 214a may be grounded. If not included, at least one of the processing suppression power supply 253a and the cleaning suppression power supply 253b may provide the path by which the suppression electrode 214a may be grounded.

Ion source chamber 202 may also be switched between two different power supplies. For example, an extraction power supply 254 may be used to provide power during the processing mode and the cleaning mode. A switch 436 may be used to switch between the processing extraction power supply 254a (as shown in FIG. 3a) and a cleaning extraction power supply 254b (as shown in FIG. 3b). In some embodiments, the ion source chamber 202 may be grounded during the cleaning process, thus obviating the need for a separate cleaning extraction power supply 254b. In this embodiment, switch 436 would be used to select either processing extraction power supply 254a or ground.

Similarly, the ground electrode 214b may be switched between two different power supplies. For example, a ground electrode power supply 255 may be used to provide power during the processing mode and the cleaning mode. A switch 437 may be used to switch between the processing ground electrode power supply 255a (as shown in FIG. 3a) and a cleaning ground electrode power supply 255b (as shown in FIG. 3b). In some embodiments, the same ground electrode power supply is used in both processing and cleaning modes. For example, in both modes, the ground electrode 214b may be grounded. In this embodiment, there may be no need for ground electrode power supply 255, and the ground electrode 214b is simply connected to ground.

Those of ordinary skill in the art will recognize that there may also be one or more additional power supplies (not shown) that provide power to the ion source chamber 202, the filament 214, the cathode 206, and the ground electrode 214b during the processing/cleaning mode.

In the present embodiment, operation of the processing suppression power supply 253a, including the current and voltage provided to the suppression electrode 214a, may be similar to the operation of the power supply 253a described in FIGS. 2 and 3a during the processing mode. The suppression electrode 214a may be powered by the processing power supply 253a during the processing mode and may reduce the movement of electrons in the ions 10 as the ions 10 are extracted from the ion source chamber 202. Similarly, the operation of the cleaning suppression power supply 253b may be similar to the operation of the power supply 253b described in FIG. 3b during the cleaning mode. The suppression electrode 214a may generate the second plasma 222 with the current and/or voltage provided by the cleaning power supply 253b. The first ground path 253c, meanwhile, may be provided to enable grounding of the suppression electrode 214a, if desired.

The first switch 434 may couple the suppression electrode 214a to one of the processing suppression power supply 253a, the cleaning suppression power supply 253b, and the first ground path 253c. Meanwhile, a second switch 436 may also be provided to couple the ion source chamber 202 to one of the processing extraction power supply 254a and the cleaning extraction power supply 253b. A third switch 437 may also be provided to couple the ground electrode 214b to one of the processing ground electrode power supply 255a and the cleaning ground electrode power supply 255b. As stated above, in some embodiments, the ground electrode 214b is maintained at the same voltage during both operations and a third switch 437 may not be needed. The first, second and third switches 434, 436 and 437 may be controlled by a controller 438.

During the processing mode, the suppression electrode 214a may be electrically coupled to the processing suppression power supply 253a via the first switch 434. The ions 10 generated in the ion source chamber 202 may be extracted by the suppression electrode 214a and the ground electrode 214b. Meanwhile, the ion source chamber 202 may be biased by the processing extraction power supply 254a.

During the cleaning mode, the suppression electrode 214a may be electrically coupled to the cleaning suppression power supply 253b via the first switch 434. Meanwhile, the ion source chamber 202 may be connected to the cleaning extraction power supply 254b during the cleaning mode by the second switch 436. Optionally, the ground electrode 214b may be grounded during both operations.

As illustrated in the figure, the cleaning suppression power supply 253b of the present embodiment may be coupled to the suppression electrode 214a, and the second plasma 222 may be generated on either side of the suppression electrode 214a. For example, the second plasma 222 may be created on either side of the suppression electrode 214a due to the difference in bias voltage between the suppression electrode 214a and each of the ion source chamber 202 and ground electrode 214b. The second plasma 222 may allow the materials accumulated near the suppression electrode 214a and the ground electrode 214b to be removed effectively.

Figure 5:
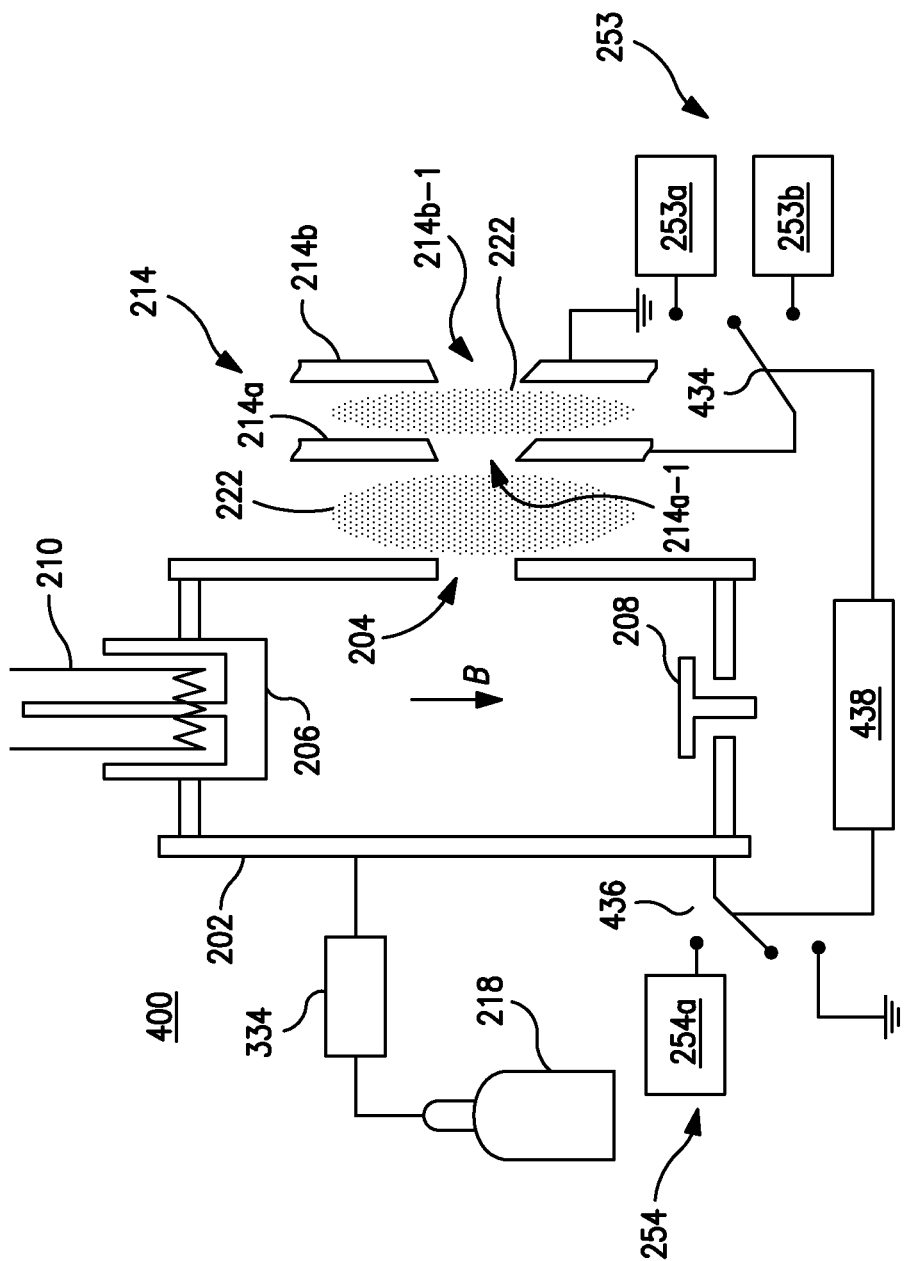
FIG. 5 shows an ion source according to a third embodiment.

FIG. 5 shows an embodiment of the ion source, as used in one particular embodiment. It should be appreciated that many of the components illustrated in FIG. 4 are incorporated into FIG. 5. Such components, and their operation, should be understood in relation to the components in FIG. 4. In this embodiment, the ground electrode 214b is grounded during both processing mode and cleaning mode. The ion source chamber 202 is switched between the processing extraction power supply 254a, used during processing mode, and ground, which is used during the cleaning mode. The suppression electrode 214a is switched between the processing suppression power supply 253a and the cleaning suppression power supply 253b. As described above, the cleaning suppression power supply may provide between 400 and 1000V at currents of between about 1 A and 5 A. Two switches 434, 436 are used to switch the suppression electrode 214a and the ion source chamber 202, respectively. The switching between modes is performed using controller 438.

It should be noted that, in some embodiments, the use of AC voltage or pulsed DC voltage in the cleaning suppression power supply 253b may be beneficial. When the voltage of the suppression electrode 214a is more positive than that of the ion source chamber 202 and the ground electrode 214b, energetic positive ions from plasma 222 will be driven away from the suppression electrode 214a and toward these lower potential components. By using an AC voltage, the energetic positive ions move first away from either side of the suppression electrode 214a, and later toward the suppression electrode 214a when its voltage is more negative than that of the ground electrode 214b and the ion source chamber 202. This allows all components to be effectively cleaned. Pulsed DC voltage may have a similar effect. In addition, the changing cleaning voltages cause continuous redistribution of the ions and electrons in the plasma 222.

FIG. 5 shows an embodiment where the suppression electrode 214a is powered during the cleaning mode while the ion source chamber 202 and the ground electrode 214b are both grounded. However, other embodiments are also possible. For example, referring to FIG. 4, the ion source chamber 202 may be supplied with a cleaning voltage similar to that described above for the suppression electrode 214a in FIG. 5, while the suppression electrode 214a may be grounded. This configuration would cause the creation of a second plasma 222 between the ion source chamber 202 and the suppression electrode 214a. Similarly, the ground electrode 214b may be supplied with a cleaning voltage similar to that for the suppression electrode 214a in FIG. 5, while the suppression electrode 214a may be grounded. This configuration would cause the creation of a second plasma 222 between the ground electrode 214b and the suppression electrode 214a. In still another embodiment, cleaning voltages may be applied to both the ion source chamber 202 and the ground electrode 214b while the suppression electrode 214a is grounded. In another embodiment, cleaning voltages may be applied to all three of these components. For example, an AC cleaning voltage may be applied to all three components, where the phase of the voltage applied to the suppression electrode 214a is 180° out of phase with the voltage applied to the ion source chamber 202 and the ground electrode 214b. In yet another embodiment, three different voltages are applied to the three components, such that there is a potential difference between any two adjacent components. For example, the ground electrode 214b may be grounded, the suppression electrode may be between 400-1000V and the ion source chamber may be between 800-2000V. This configuration also creates the desired potential difference between components that is required for the generation of a second plasma 222.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source comprising:
    an ion source chamber for generation of a plasma during a processing mode, having an extraction aperture disposed on one surface;
    a suppression electrode having a suppression electrode aperture disposed therein, said suppression electrode disposed proximate said extraction aperture;
    a ground electrode having a ground electrode aperture disposed therein, said ground electrode disposed proximate said suppression electrode;

an extraction power supply in communication with said ion source chamber, configured to supply a first extraction voltage and current during said processing mode and a second extraction voltage and current during a cleaning mode; and a suppression power supply in communication with said suppression electrode, configured to supply a first suppression voltage and current during said processing mode and a second suppression voltage and current during said cleaning mode, wherein a difference between said second extraction voltage and said second suppression voltage is sufficient to create a plasma in a volume defined between said extraction aperture and said suppression electrode.

2. The ion source of claim 1, comprising a feed source containing a cleaning agent and in communication with said ion source chamber and a flowrate controller to regulate flow of said cleaning agent, wherein said flowrate controller is configured to create a flow rate of said cleaning agent sufficient to create said plasma in said volume.

3. The ion source of claim 2, wherein said flow rate of said cleaning agent is at least 50 standard cubic centimeters per minute (SCCM).

4. The ion source of claim 1, wherein at least one of said second suppression current and said second extraction current is between 1 amp and 5 amps.

5. The ion source of claim 1, further comprising a ground electrode power supply in communication with said ground electrode, configured to supply a first ground electrode voltage and current during said processing mode and a second ground electrode voltage and current during said cleaning mode.

6. The ion source of claim 5, wherein said ground electrode is grounded during said cleaning mode and said processing mode.

7. The ion source of claim 1, wherein said suppression power supply comprises a processing suppression power supply, a cleaning suppression power supply and a switch to couple one of said processing suppression power supply and said cleaning suppression power supply to said suppression electrode based on a mode of operation.

8. The ion source of claim 1, wherein said extraction power supply comprises a processing extraction power supply, a cleaning extraction power supply and a switch to couple one of said processing extraction power supply and said cleaning extraction power supply to said ion source chamber based on a mode of operation.

9. A method of cleaning an ion source, wherein said ion source comprises an ion source chamber having an extraction aperture, a ground electrode, and a suppression electrode disposed between said ion source chamber and said ground electrode, comprising:

flowing a cleaning agent into said ion source chamber;

applying a respective voltage to each of said ion source chamber, said suppression electrode and said ground electrode, such that a difference in voltage between said suppression electrode and each of said ion source chamber and said ground electrode is sufficient to generate a plasma from said cleaning agent in a volume defined between said extraction aperture and said ground electrode; and wherein said generation of said plasma causes cleaning of said extraction aperture, said suppression electrode and said ground electrode.

10. The method of claim 9, wherein said suppression electrode is provided with a voltage of between 400V and 1000V at a current of between 1 A and 5 A, and said ion source chamber and said ground electrode are grounded.

11. The method of claim 10, where said current provided to said suppression electrode generates more than 1 kilowatt of heat, said heat further enhancing said cleaning.

12. The method of claim 9, wherein said cleaning agent is selected from the group comprising oxygen, $NF_3$ and a mixture of argon and fluorine.

13. The method of claim 9, wherein a magnetic field is applied to confine said plasma to said volume defined between said extraction aperture and said ground electrode.

14. The method of claim 9, wherein a flow rate of said cleaning agent is greater than 50 standard cubic centimeters per minute (SCCM).

15. An ion source comprising:

an ion source chamber for generation of a plasma during a processing mode, having an extraction aperture disposed on one surface;

a suppression electrode having a suppression electrode aperture disposed therein, said suppression electrode disposed proximate said extraction aperture;

a ground electrode having a ground electrode aperture disposed therein, said ground electrode disposed proximate said suppression electrode and connected to ground;

an extraction power supply in communication with said ion source chamber, comprising a first switch and processing extraction power supply to supply a first extraction voltage and current during said processing mode, wherein said first switch couples said ion source chamber to ground during a cleaning mode;

a suppression power supply in communication with said suppression electrode, said suppression power supply comprising a processing suppression power supply to supply a first suppression voltage and current during said processing mode, a cleaning suppression power supply to supply a second suppression voltage and current during said cleaning mode, and a second switch to select between said processing suppression power supply and said cleaning suppression power supply;

a feed source containing a cleaning agent and in communication with said ion source chamber; and a flowrate controller to regulate flow of said cleaning agent, wherein said flowrate controller is configured to create a flow rate of said cleaning agent of at least 10 standard cubic centimeters per minute (SCCM) during said cleaning mode, wherein said cleaning suppression power supply provides a voltage of between 400 and 1000V at a current of between 1 A and 5 A to said suppression electrode such that a plasma is created between said suppression electrode and said ion source chamber and between said suppression electrode and said ground electrode.

16. The ion source of claim 15, further comprising source magnets to create a magnetic field to confine said plasma to a volume defined by said extraction aperture and said ground electrode.

17. The ion source of claim 15, further comprising a controller to actuate said first switch and said second switch to control a mode of operation of said ion source.

18. The ion source of claim 17, further comprising a filament and a cathode disposed in said ion source chamber to create a plasma in said processing mode, wherein said controller disables said filament and said cathode during said cleaning mode.

19. The ion source of claim 15, wherein said cleaning agent is selected from the group comprising oxygen, $NF_3$ and a mixture of argon and fluorine.

20. The ion source of claim 15, wherein said flowrate controller is configured to create a flow rate of said cleaning agent of at least 50 standard cubic centimeters per minute (SCCM) during said cleaning mode.

* * * * *